US012525950B2

(12) United States Patent
Tang et al.

(10) Patent No.: US 12,525,950 B2
(45) Date of Patent: *Jan. 13, 2026

(54) ACOUSTIC WAVE RESONATOR WITH ROTATED AND TILTED INTERDIGITAL TRANSDUCER ELECTRODE

(71) Applicant: Skyworks Solutions, Inc., Irvine, CA (US)

(72) Inventors: Gong Bin Tang, Moriguchi (JP); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 388 days.

This patent is subject to a terminal disclaimer.

(21) Appl. No.: 18/166,226

(22) Filed: Feb. 8, 2023

(65) Prior Publication Data

US 2023/0275565 A1    Aug. 31, 2023

Related U.S. Application Data

(63) Continuation of application No. 16/931,206, filed on Jul. 16, 2020, now Pat. No. 11,606,078.

(Continued)

(51) Int. Cl.
*H03H 9/145* (2006.01)
*H03H 9/02* (2006.01)
(Continued)

(52) U.S. Cl.
CPC .... *H03H 9/14547* (2013.01); *H03H 9/02559* (2013.01); *H03H 9/02574* (2013.01);
(Continued)

(58) Field of Classification Search
CPC ............ H03H 9/02; H03H 9/145; H03H 9/25; H03H 9/64
See application file for complete search history.

(56) References Cited

U.S. PATENT DOCUMENTS 5,646,584 A    7/1997 Kondratyev et al.
5,895,996 A *  4/1999 Takagi ..................... H03H 9/25
                                              310/313 R
(Continued)

FOREIGN PATENT DOCUMENTS

CN    113098432 A    7/2021
FR     3105894 A1    7/2021
(Continued)

OTHER PUBLICATIONS

Iwamoto et al., "Transverse Modes in I.H.P. SAW Resonator and Their Suppression Method", Murata Manufacturing co., Ltd., (2018), in parent IFW.
(Continued)

*Primary Examiner* — Andrea Lindgren Baltzell
*Assistant Examiner* — Alan Wong
(74) *Attorney, Agent, or Firm* — Knobbe, Martens, Olson & Bear, LLP

(57) ABSTRACT

Acoustic wave resonators are disclosed that include a piezoelectric layer and an interdigital transducer electrode over the piezoelectric layer. The interdigital transducer electrode has a rotation angle and a tilt angle. The rotation angle and the tilt angle can together increase a figure of merit of the acoustic wave device. The rotation angle and the tilt angle can both be non-zero.

18 Claims, 12 Drawing Sheets

Related U.S. Application Data

(60) Provisional application No. 62/875,864, filed on Jul. 18, 2019.

(51) Int. Cl.
*H03H 9/25* (2006.01)
*H03H 9/64* (2006.01)
*H03H 9/72* (2006.01)
*H04B 1/40* (2015.01)

(52) U.S. Cl.
CPC .......... *H03H 9/02992* (2013.01); *H03H 9/25* (2013.01); *H03H 9/64* (2013.01); *H03H 9/725* (2013.01); *H04B 1/40* (2013.01)

(56) References Cited

U.S. PATENT DOCUMENTS

| | | |
|---|---|---|
| 7,230,512 B1 | 6/2007 | Carpenter et al. |
| 7,352,104 B2 * | 4/2008 | Yamazaki ................ H03H 3/08 310/313 D |
| 7,554,242 B2 | 6/2009 | Aoki et al. |
| 8,294,331 B2 | 10/2012 | Abbott et al. |
| 8,741,683 B2 | 6/2014 | Huang et al. |
| 9,065,424 B2 | 6/2015 | Nakanishi et al. |
| 9,124,240 B2 | 9/2015 | Shimizu et al. |
| 9,136,458 B2 | 9/2015 | Komatsu et al. |
| 9,257,960 B2 | 2/2016 | Ruile et al. |
| 9,413,330 B2 | 8/2016 | Shimizu et al. |
| 9,419,584 B2 | 8/2016 | Tsuranari et al. |
| 9,438,201 B2 | 9/2016 | Hori et al. |
| 9,537,464 B2 | 1/2017 | Yamanaka |
| 9,640,750 B2 | 5/2017 | Nakanishi et al. |
| 9,641,152 B2 | 5/2017 | Nakamura et al. |
| 9,673,779 B2 | 6/2017 | Ruile et al. |
| 9,748,923 B2 | 8/2017 | Kando et al. |
| 9,748,924 B2 | 8/2017 | Komatsu et al. |
| 10,090,825 B2 | 10/2018 | Kuroyanagi |
| 10,153,748 B2 | 12/2018 | Tanaka |
| 10,361,678 B2 | 7/2019 | Iwaki et al. |
| 10,476,470 B2 * | 11/2019 | Takamine ............ H10N 30/704 |
| 10,483,942 B2 | 11/2019 | Goto et al. |
| 10,574,207 B2 | 2/2020 | Yoon et al. |
| 10,727,844 B1 | 7/2020 | Gong et al. |
| 10,749,497 B2 | 8/2020 | Tang et al. |
| 10,826,507 B1 | 11/2020 | Gong et al. |
| 10,873,313 B2 | 12/2020 | Zou et al. |
| 11,050,406 B2 | 6/2021 | Maki et al. |
| 11,095,266 B2 | 8/2021 | Inoue et al. |
| 11,165,411 B2 | 11/2021 | Liu et al. |
| 11,239,817 B2 | 2/2022 | Hatano et al. |
| 11,245,378 B2 | 2/2022 | Tang et al. |
| 11,296,672 B2 | 4/2022 | Hiratsuka et al. |
| 11,368,137 B2 | 6/2022 | Goto et al. |
| 11,522,514 B2 | 12/2022 | Zou et al. |
| 11,606,078 B2 * | 3/2023 | Tang ................ H03H 9/02559 |
| 11,616,491 B2 | 3/2023 | Tang et al. |
| 11,677,380 B2 | 6/2023 | Fujiwara et al. |
| 11,722,122 B2 | 8/2023 | Goto et al. |
| 11,750,172 B2 | 9/2023 | Goto et al. |
| 11,824,515 B2 | 11/2023 | Tang et al. |
| 11,962,283 B2 | 4/2024 | Zou et al. |
| 12,040,784 B2 | 7/2024 | Tang et al. |
| 12,047,053 B2 | 7/2024 | Maki et al. |
| 2004/0222717 A1 | 11/2004 | Matsuda et al. |
| 2005/0077982 A1 | 4/2005 | Funasaka |
| 2005/0127781 A1 | 6/2005 | Yamazaki et al. |
| 2008/0018417 A1 | 1/2008 | Igaki et al. |
| 2010/0265010 A1 | 10/2010 | Jian |
| 2012/0049968 A1 | 3/2012 | Owaki et al. |
| 2014/0285287 A1 | 9/2014 | Komatsu et al. |
| 2014/0339957 A1 | 11/2014 | Tajima et al. |
| 2016/0294361 A1 | 10/2016 | Yamane et al. |
| 2017/0063332 A1 | 3/2017 | Gilbert et al. |
| 2017/0099043 A1 | 4/2017 | Goto et al. |
| 2017/0104470 A1 | 4/2017 | Koelle et al. |
| 2017/0214385 A1 | 7/2017 | Bhattacharjee |
| 2017/0214386 A1 | 7/2017 | Kido |
| 2017/0222618 A1 | 8/2017 | Inoue |
| 2017/0250669 A1 | 8/2017 | Kuroyanagi et al. |
| 2017/0272051 A1 | 9/2017 | Kurihara et al. |
| 2017/0273183 A1 | 9/2017 | Kawasaki et al. |
| 2017/0288629 A1 | 10/2017 | Bhattacharjee et al. |
| 2017/0359048 A1 | 12/2017 | Yasuda |
| 2018/0013404 A1 | 1/2018 | Kawasaki et al. |
| 2018/0048290 A1 | 2/2018 | Sekine et al. |
| 2018/0097501 A1 | 4/2018 | Kikuchi et al. |
| 2018/0097508 A1 | 4/2018 | Iwamoto et al. |
| 2018/0138893 A1 | 5/2018 | Caron |
| 2018/0316329 A1 | 11/2018 | Guenard et al. |
| 2018/0367119 A1 | 12/2018 | Lee |
| 2019/0288661 A1 | 9/2019 | Akiyama et al. |
| 2019/0319772 A1 | 10/2019 | Ando et al. |
| 2019/0379347 A1 | 12/2019 | Goto et al. |
| 2020/0036362 A1 | 1/2020 | Daimon |
| 2020/0067482 A1 | 2/2020 | Maki et al. |
| 2020/0106420 A1 | 4/2020 | Kodama et al. |
| 2020/0144984 A1 | 5/2020 | Fukuhara et al. |
| 2020/0212875 A1 | 7/2020 | Goto et al. |
| 2020/0212883 A1 | 7/2020 | Goto et al. |
| 2020/0220522 A1 | 7/2020 | Nosaka |
| 2020/0358424 A1 | 11/2020 | Kaneda et al. |
| 2020/0366268 A1 | 11/2020 | Goto et al. |
| 2020/0366270 A1 | 11/2020 | Matsuoka |
| 2020/0389151 A1 | 12/2020 | Goto |
| 2021/0050842 A1 | 2/2021 | Tang et al. |
| 2021/0058057 A1 | 2/2021 | Goto et al. |
| 2021/0126616 A1 | 4/2021 | Hiramatsu et al. |
| 2021/0167748 A1 | 6/2021 | Huck et al. |
| 2021/0297060 A1 | 9/2021 | Omura et al. |
| 2022/0014152 A1 | 1/2022 | Gebeyehu et al. |
| 2022/0014175 A1 | 1/2022 | Nagatomo et al. |
| 2022/0077840 A1 | 3/2022 | Caron |
| 2022/0360249 A1 | 11/2022 | Ballandras et al. |
| 2023/0107376 A1 | 4/2023 | Goto et al. |
| 2023/0163748 A1 | 5/2023 | Goto et al. |
| 2023/0208398 A1 | 6/2023 | Goto et al. |
| 2023/0208399 A1 | 6/2023 | Goto et al. |
| 2023/0336152 A1 | 10/2023 | Goto et al. |
| 2023/0336153 A1 | 10/2023 | Goto et al. |
| 2023/0344411 A1 | 10/2023 | Chen et al. |
| 2023/0344415 A1 | 10/2023 | Chen et al. |
| 2023/0344416 A1 | 10/2023 | Chen et al. |
| 2024/0186978 A1 | 6/2024 | Hiramatsu et al. |

FOREIGN PATENT DOCUMENTS

| | | |
|---|---|---|
| JP | 2009-219045 A | 9/2009 |
| JP | 2014-135624 A | 7/2014 |
| JP | 2020-092422 A | 6/2020 |
| WO | WO 2017/161303 A1 | 9/2017 |

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.

Solal et al., "A method to reduce losses in buried electrodes RF SAW resonators," 2011 IEEE International Ultrasonics Symposium, 2011, pp. 324-332, doi: 10.1109/ULTSYM.2011.0078.

* cited by examiner

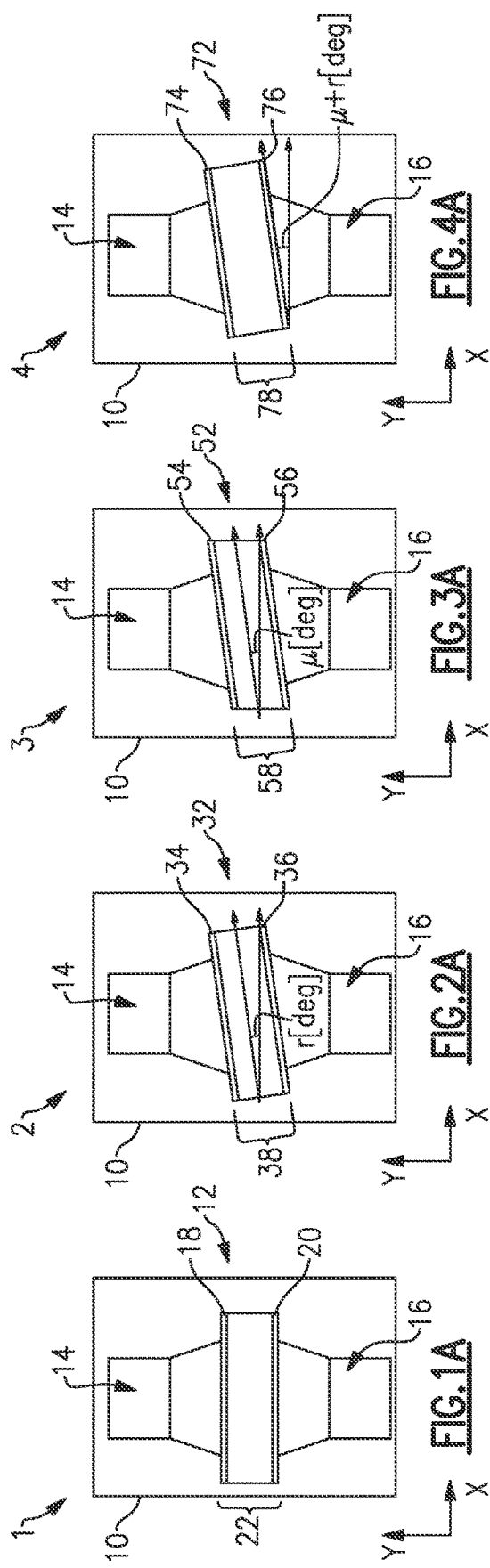

| Qs | Mu=0 | Mu=2 | Mu=4 | Mu=6 | Mu=8 | Mu=10 | Mu=12 | Mu=14 |
|---|---|---|---|---|---|---|---|---|
| -10 | 399 | 401 | 388 | 392 | 395 | 287 | 352 | 399 |
| -8 | 324 | 343 | 353 | 381 | 253 | 406 | 398 | 367 |
| -6 | 302 | 322 | 300 | 346 | 353 | 368 | 300 | 378 |
| -4 | 325 | 416 | 365 | 400 | 399 | 371 | 372 | 348 |
| -2 | 391 | 383 | 372 | 361 | 349 | 339 | 342 | 338 |
| 0 | 402 | 333 | 306 | 338 | 306 | 283 | 329 | 255 |
| 2 | 303 | 319 | 334 | 332 | 323 | 280 | 199 | 316 |
| 4 | 370 | 342 | 350 | 335 | 202 | 232 | 294 | 326 |
| 6 | 337 | 342 | 324 | 330 | 335 | 334 | 199 | 316 |
| 8 | 315 | 268 | 347 | 292 | 284 | 316 | 284 | 323 |
| 10 | 399 | 343 | 372 | 350 | 400 | 352 | 340 | 348 |

FIG.5A

| Qp | Mu=0 | Mu=2 | Mu=4 | Mu=6 | Mu=8 | Mu=10 | Mu=12 | Mu=14 |
|---|---|---|---|---|---|---|---|---|
| -10 | 1435 | 1481 | 1410 | 1133 | 462 | 753 | 1043 | 1612 |
| -8 | 1504 | 1183 | 1360 | 1498 | 1450 | 1401 | 1573 | 1907 |
| -6 | 1735 | 1495 | 1348 | 1168 | 1484 | 1081 | 1578 | 2075 |
| -4 | 1482 | 1252 | 1323 | 1561 | 1334 | 1516 | 1958 | 2139 |
| -2 | 1250 | 1106 | 1523 | 1795 | 1700 | 1532 | 1891 | 1845 |
| 0 | 1016 | 1254 | 1491 | 1787 | 1429 | 1486 | 1206 | 1576 |
| 2 | 1299 | 1292 | 1864 | 1801 | 1590 | 1570 | 1360 | 1424 |
| 4 | 1462 | 1417 | 1505 | 1962 | 1477 | 1412 | 1239 | 1101 |
| 6 | 1433 | 1742 | 1794 | 1806 | 1387 | 1217 | 1076 | 978 |
| 8 | 1413 | 1493 | 1409 | 1294 | 1153 | 962 | 773 | 828 |
| 10 | 1395 | 1370 | 1366 | 1241 | 1018 | 910 | 682 | 665 |

FIG.5B

| K2 | Mu=0 | Mu=2 | Mu=4 | Mu=6 | Mu=8 | Mu=10 | Mu=12 | Mu=14 |
|---|---|---|---|---|---|---|---|---|
| −10 | 8.4% | 8.3% | 8.4% | 8.3% | 8.3% | 8.4% | 8.5% | 8.4% |
| −8 | 8.7% | 8.6% | 8.8% | 8.8% | 9.1% | 9.0% | 8.9% | 8.9% |
| −6 | 9.3% | 9.3% | 9.2% | 9.2% | 9.5% | 9.3% | 9.3% | 9.2% |
| −4 | 9.9% | 9.9% | 9.7% | 9.6% | 9.8% | 9.9% | 9.8% | 9.7% |
| −2 | 10.0% | 10.0% | 10.1% | 10.0% | 10.0% | 10.0% | 9.9% | 9.7% |
| 0 | 10.0% | 10.0% | 10.2% | 10.2% | 10.0% | 9.8% | 9.7% | 9.9% |
| 2 | 10.0% | 9.8% | 9.8% | 9.9% | 9.9% | 9.7% | 9.6% | 9.8% |
| 4 | 9.9% | 9.7% | 9.7% | 9.7% | 9.8% | 9.4% | 9.3% | 9.6% |
| 6 | 9.7% | 9.6% | 9.5% | 9.3% | 9.4% | 8.8% | 8.7% | 9.2% |
| 8 | 9.0% | 9.0% | 8.9% | 8.8% | 8.8% | 8.8% | 8.7% | 8.7% |
| 10 | 8.3% | 8.4% | 8.3% | 8.3% | 8.2% | 8.2% | 8.2% | 8.1% |

FIG. 5C $FOM = (Qs+Qp)*K2$

| FOM | Mu=0 | Mu=2 | Mu=4 | Mu=6 | Mu=8 | Mu=10 | Mu=12 | Mu=14 |
|---|---|---|---|---|---|---|---|---|
| −10 | 154.2 | 156.3 | 150.1 | 126.4 | 71.0 | 87.5 | 119.1 | 169.5 |
| −8 | 158.5 | 130.7 | 150.0 | 165.5 | 154.6 | 163.0 | 175.4 | 203.3 |
| −6 | 190.4 | 169.4 | 150.8 | 138.8 | 173.8 | 134.3 | 174.5 | 226.3 |
| −4 | 178.1 | 165.2 | 164.4 | 189.1 | 169.4 | 186.6 | 229.3 | 240.1 |
| −2 | 164.9 | 148.6 | 190.5 | 214.7 | 205.1 | 186.3 | 220.5 | 212.4 |
| 0 | 142.4 | 158.4 | 182.5 | 215.9 | 173.7 | 176.7 | 152.1 | 180.8 |
| 2 | 160.7 | 158.5 | 216.0 | 212.1 | 188.5 | 180.4 | 150.5 | 170.3 |
| 4 | 181.2 | 171.1 | 180.1 | 223.3 | 165.2 | 160.1 | 147.2 | 136.7 |
| 6 | 171.4 | 200.3 | 200.7 | 198.5 | 162.4 | 145.3 | 119.0 | 118.7 |
| 8 | 155.6 | 157.6 | 156.4 | 139.3 | 126.7 | 112.1 | 92.4 | 99.6 |
| 10 | 149.2 | 143.8 | 144.8 | 132.6 | 116.3 | 103.5 | 83.7 | 82.2 |

FIG. 5D

ACOUSTIC WAVE RESONATOR WITH ROTATED AND TILTED INTERDIGITAL TRANSDUCER ELECTRODE

CROSS REFERENCE TO PRIORITY APPLICATION

This application is a continuation of U.S. application Ser. No. 16/931,206, filed on Jul. 16, 2020, which claims the benefit of priority of U.S. Provisional Patent Application No. 62/875,864, filed Jul. 18, 2019 and titled "ACOUSTIC WAVE RESONATOR WITH ROTATED AND TILTED INTERDIGITAL TRANSDUCER ELECTRODE," the disclosure which is hereby incorporated by reference in its entirety herein and for all purposes.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

Certain SAW resonators, such as multi-layer piezoelectric substrate (MPS) SAW resonators, can experience transverse modes. Such surface acoustic wave resonators may achieve a figure of merit (FOM) that is less than desired. Suppressing transverse modes and achieving a high FOM can be desirable.

SUMMARY

The innovations described in the claims each have several aspects, no single one of which is solely responsible for its desirable attributes. Without limiting the scope of the claims, some prominent features of this disclosure will now be briefly described.

One aspect of this disclosure is an acoustic wave resonator with increased figure of merit. The acoustic wave resonator includes a piezoelectric layer and an interdigital transducer electrode over the piezoelectric layer. The interdigital transducer electrode has a rotation angle and a tilt angle. The rotation angle and the tilt angle are both non-zero. The rotation angle and the tilt angle are together configured to cause an increase in a figure of merit of the acoustic wave resonator relative to a configuration having a zero rotation angle and a zero tilt angle.

A sum of the rotation angle and the tilt angle can be in a range from 2° to 14°. A magnitude of the rotation angle can be greater than 1°. The rotation angle can be in a range from −2° to −10° and the tilt angle can be approximately 14°. The rotation angle can be in a range from 1° to 45°.

The rotation angle can be greater than the tilt angle.

A magnitude of the rotation angle can be greater than 1°. The rotation angle can be no greater than 15°.

The tilt angle can be at least 6°.

The figure of merit value of acoustic wave resonator can be above 140.

The acoustic wave resonator can further include a support substrate, and the piezoelectric layer can be positioned between the support substrate and the interdigital transducer electrode. The acoustic wave resonator can further include a low velocity layer positioned between the support substrate and the piezoelectric layer. The low velocity layer can be a silicon dioxide layer. The acoustic wave resonator can be a surface acoustic wave resonator configured to generate a surface acoustic wave. The support substrate can include spinel.

The interdigital transducer electrode can include a bus bar and fingers that extend from the bus bar, in which the bus bar and the fingers are non-perpendicular to each other. The interdigital transducer electrode can include a second bus bar and second fingers extending from the second bus bar, in which the bus bar and the second bus bar extend in approximately parallel to each other.

The piezoelectric layer can be a lithium tantalate layer.

Another aspect of this disclosure is an acoustic wave resonator that includes a multilayer piezoelectric substrate and an interdigital transducer electrode. The multilayer piezoelectric substrate includes a support substrate and a piezoelectric layer over the support substrate. The interdigital transducer electrode is over the piezoelectric layer. The interdigital transducer electrode has a rotation angle and a tilt angle. The rotation angle and the tilt angle are both non-zero. The rotation angle and the tilt angle are together configured to cause a transverse mode to be suppressed.

A sum of the rotation angle and the tilt angle can be in a range from 2° to 14°.

A magnitude of the rotation angle can be greater than 1°, and a magnitude of the tilt angle can be greater than 1°.

Another aspect of this disclosure is an acoustic wave filter that includes acoustic wave resonators arranged to filter a radio frequency signal. The acoustic wave resonators include an acoustic wave resonator that includes interdigital transducer electrode having a rotation angle and a tilt angle in accordance with any suitable principles and advantages disclosed herein.

Another aspect of this disclosure is a front end module that includes the acoustic wave filter of the preceding paragraph, other circuitry, and a package enclosing the acoustic wave filter and the other circuitry.

The other circuitry can include a multi-throw radio frequency switch. The other circuitry can include a power amplifier. The other circuitry can include a low noise amplifier.

Another aspect of this disclosure is a wireless communication device that includes an antenna and an acoustic wave filter. The acoustic wave filter is arranged to filter a radio frequency signal associated with the antenna. The acoustic wave filter includes acoustic wave resonators arranged to filter a radio frequency signal. The acoustic wave resonators include an acoustic wave resonator that includes interdigital transducer electrode having a rotation angle and a tilt angle in accordance with any suitable principles and advantages disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 1A shows a top layout view of a surface acoustic wave (SAW) resonator.

FIG. 1B shows a close-up view of a portion of the SAW resonator shown in FIG. 1A.

FIG. 2A shows a top layout view of a SAW resonator with a rotated interdigital transducer (IDT) electrode.

FIG. 2B shows a close-up view of a portion of the SAW resonator shown in FIG. 2A.

FIG. 3A shows a top layout view of a SAW resonator with a tilted IDT electrode.

FIG. 3B shows a close-up view of a portion of the SAW resonator shown in FIG. 3A.

FIG. 4A shows a top layout view of a SAW resonator with a rotated and tilted IDT electrode according to an embodiment.

FIG. 4B shows a close-up view of a portion of the SAW resonator shown in FIG. 4A.

FIG. 5A is a table showing simulated quality factor Qs of a SAW resonator according to one embodiment for various tilt angles μ and rotation angles r.

FIG. 5B is a table showing simulated quality factor Qp of the SAW corresponding to FIG. 5A.

FIG. 5C is a table showing simulated electromechanical coupling coefficients $k^2$ of the SAW resonator corresponding to FIG. 5A.

FIG. 5D is a table showing simulated figure of merit (FOM) values of the SAW resonator corresponding to FIG. 5A.

DETAILED DESCRIPTION OF CERTAIN EMBODIMENTS

Figure 4C:
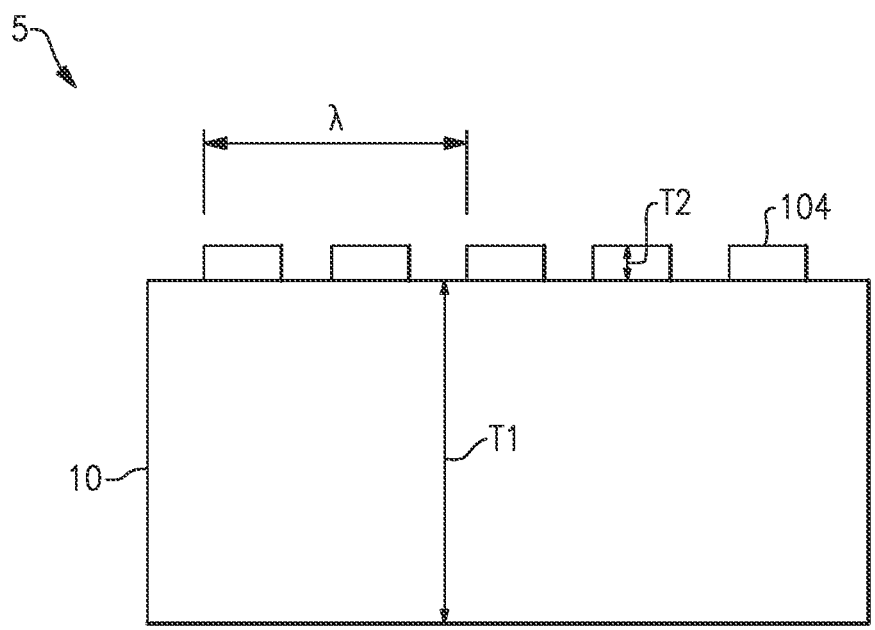
FIG. 4C is a diagram of a cross section of a SAW resonator according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). A SAW resonator can be configured to generate, for example, a Rayleigh mode surface acoustic wave or a shear horizontal mode surface acoustic wave. Although embodiments may be discussed with reference to SAW resonators, any suitable principles and advantages disclosed herein can be implemented in any suitable SAW device.

In general, high quality factor (Q), large effective electromechanical coupling coefficient ($k^2$), high frequency ability, and spurious free response can be significant aspects for micro resonators to enable low-loss filters, stable oscillators, and sensitive sensors.

SAW resonators can include a multilayer piezoelectric substrate. Multi-layer piezoelectric substrates can provide good thermal dissipation characteristics and improved temperature coefficient of frequency (TCF) relative to certain single layer piezoelectric substrates. For example, certain SAW resonators with a piezoelectric layer on a high impedance layer, such as silicon, can achieve a better temperature coefficient of frequency (TCF) and thermal dissipation compared to similar devices without the high impedance layer. A better TCF can contribute to obtaining the large effective electromechanical coupling coefficient ($k^2$).

SAW resonators can have a relatively strong transverse mode in and/or near a pass band. The presence of the relatively strong transverse modes can hinder the accuracy and/or stability of oscillators and sensors, as well as hurt the performance of acoustic wave filters by creating relatively severe passband ripples and possibly limiting the rejection. Therefore, transverse mode suppression can be significant for SAW resonators.

Tilted interdigital transducer (IDT) electrodes can be used to suppress transverse modes in multi-layer piezoelectric substrate (MPS) SAW resonators. This disclosure provides a technical solution to suppressing transverse modes of MPS SAW resonators using a combination of tilt angle and rotation angle. The combination of tilt angle and rotation angle can improve transverse mode suppression relative to tilt angle alone.

Aspects of this disclosure relate to a SAW resonator with an angled IDT electrode for transverse mode suppression. The angled IDT electrode is positioned on a piezoelectric layer. The angled IDT is rotated and tilted. The piezoelectric layer can be a multilayer piezoelectric substrate.

Embodiments of SAW resonators disclosed herein include an interdigital transducer (IDT) electrode that has a rotation angle and a tilt angle. An IDT includes bus bars and fingers extending from the bus bars. A SAW resonator with the rotation angle of 0° and the tilt angle of 0° has a horizontal reference axis that is in parallel with a wave propagation direction of the SAW resonator (e.g., a crystal reference). The SAW resonator also has a vertical reference axis that is in parallel with a longitudinal direction of a finger of the IDT electrode when the SAW resonator has a rotation angle of 0° and the tilt angle of 0°. The rotation angle refers to a third Euler angle ψ of Euler angles (φ, 0, ψ). The rotation angle can refer to an angle of the entire IDT electrode structure (the fingers and the bus bar) relative to the horizontal reference axis of the SAW resonator. The tilt angle refers to an angle of the bus bar relative to the horizontal reference axis of wave propagation in the SAW resonator while the fingers of the IDT electrode are parallel to the vertical reference axis.

FIGS. 1A, 2A, 3A, and 4A show top layout views of different surface acoustic wave (SAW) resonators. FIGS. 1B, 2B, 3B, and 4B show close-up views of portions of FIGS. 1A, 2A, 3A, and 4A, respectively. FIGS. 1A to 4B are illustrated along the same horizontal axis and with parallel vertical axes.

FIG. 1A shows a top layout view of a SAW resonator 1. The SAW resonator 1 includes a piezoelectric layer 10 and an interdigital transducer (IDT) electrode 12 over the piezoelectric layer 10. The illustrated the SAW resonator 1 includes a first interconnect 14 and a second interconnect 16. The IDT electrode 12 of the SAW resonator 1 include a first bus bar 18, a second bus bar 20, and a finger region 22. The first interconnect 14 is electrically connected to the first bus bar 18. The second interconnect 16 is electrically connected to the second bus bar 20. The finger region 22 is positioned between the first bus bar 18 and the second bus bar 20.

FIG. 1B shows a close-up view of a portion of the first bus bar 18 and a portion of the finger region 22 of the SAW resonator 1 shown in FIG. 1A. The finger region 22 includes first fingers 24 that extend from the first bus bar 18 and second fingers 26 that extend from the second bus bar 20. The finger region 22 includes first dummy fingers 28 that extend from the first bus bar 18. The dummy fingers 28 are shorter than the first fingers 24. The dummy fingers 28 can function as pseudo-electrodes for preventing interference with the propagation of a wave generated by the first fingers 24. The finger region 22 also includes second dummy fingers (not shown in FIG. 1B) that extend from the second bus bar 20.

The first bus bar 18 and the second bus bar 20 extend in parallel along a horizontal axis x. The first fingers 24 and the second fingers 26 extend along a vertical axis y that is perpendicular to the horizontal axis x. Therefore, the illustrated IDT electrodes 12 of the SAW resonator 1 has a rotation angle r relative to the horizontal axis x of 0° and a tilt angle μ relative to the vertical axis y of 0°.

FIG. 2A shows a top layout view of a SAW resonator 2. The SAW resonator 2 includes a piezoelectric layer 10 and an IDT electrode 32 over the piezoelectric layer 10. The illustrated the SAW resonator 2 includes a first interconnect 14 and a second interconnect 16. The IDT electrode 32 of the SAW resonator 2 includes a first bus bar 34, a second bus bar 36, and a finger region 38. The first interconnect 14 is electrically connected to the first bus bar 34. The second interconnect 16 is electrically connected to the second bus bar 36.

FIG. 2B shows a close-up view of a portion of the first bus bar 34 and a portion of the finger region 38 of the SAW resonator 2 shown in FIG. 2A. The finger region 38 includes first fingers 40 that extend from the first bus bar 34 and second fingers 42 that extend from the second bus bar 36. The finger region 38 includes first dummy fingers 44 that extend from the first bus bar 34. The finger region 38 also includes second dummy fingers (not shown in FIG. 2B) that extend from the second bus bar 36.

The IDT electrode 32 of the SAW resonator 2 is rotated relative to the IDT electrode 12 of the SAW resonator 1. The IDT electrode 32 of the SAW resonator 2 has the rotation angle r. The illustrated IDT electrode 32 has a rotation angle r of 8°. The first fingers 40 and the second fingers 42 extend perpendicular to the first bus bar 34 and the second bus bar 36. Therefore, the illustrated IDT electrodes 32 of the SAW resonator 2 has a rotation angle r of 8° and a tilt angle μ of 0°.

FIG. 3A shows a top layout view of a SAW resonator 3. The SAW resonator 3 includes a piezoelectric layer 10 and an IDT electrode 42 over the piezoelectric layer 10. The illustrated the SAW resonator 3 includes a first interconnect 14 and a second interconnect 16. The IDT electrode 52 of the SAW resonator 3 includes a first bus bar 54, a second bus bar 56, and a finger region 58. The first interconnect 14 is electrically connected to the first bus bar 58. The second interconnect 16 is electrically connected to the second bus bar 56.

FIG. 3B shows a close-up view of a portion of the first bus bar 54 and a portion of the finger region 58 of the SAW resonator 3 shown in FIG. 3A. The finger region 58 includes first fingers 60 that extend from the first bus bar 54 and second fingers 62 that extend from the second bus bar 56. The finger region 58 includes first dummy fingers 64 that extend from the first bus bar 54. The finger region 58 also includes second dummy fingers (not shown in FIG. 3B) that extend from the second bus bar 56.

The IDT electrode 52 of the SAW resonator 3 is tilted relative to the IDT electrode 12 of the SAW resonator 1. The IDT electrode 52 of the SAW resonator 3 has a tilt angle μ. The illustrated IDT electrode 52 has the tilt angle μ of 8°. The first fingers 40 and the second fingers 42 extend along the vertical axis y. Therefore, the illustrated IDT electrode 52 of the SAW resonator 3 has a rotation angle r of 0° and the tilt angle μ of 8°.

FIG. 4A shows a top layout view of a SAW resonator 4 according to one embodiment. The SAW resonator 4 includes a piezoelectric layer 10 and an IDT electrode 72 over the piezoelectric layer 10. The illustrated the SAW resonator 4 includes a first interconnect 14 and a second interconnect 16. The IDT electrode 72 of the SAW resonator 4 includes a first bus bar 74, a second bus bar 76, and a finger region 78. The first interconnect 14 is electrically connected to the first bus bar 78. The second interconnect 16 is electrically connected to the second bus bar 76.

FIG. 4B shows a close-up view of a portion of the first bus bar 74 and a portion of the finger region 78 of the SAW resonator 4 shown in FIG. 4A. The finger region 78 includes first fingers 80 that extend from the first bus bar 74 and second fingers 82 that extend from the second bus bar 76. The finger region 78 includes first dummy fingers 84 that extend from the first bus bar 74. The finger region 78 also includes second dummy fingers (not shown in FIG. 4B) that extend from the second bus bar 76.

The IDT electrode 72 of the SAW resonator 4 is tilted and rotated relative to the IDT electrode 12 of the SAW resonator 1. Accordingly, (a) both the bus bar and fingers of the IDT electrode 72 are rotated relative to the horizontal reference axis (the illustrated x-axis) and (b) the bus bar is tilted by a non-zero angle relative to the fingers of the IDT electrode 72. The IDT electrode 72 of the SAW resonator 4 has the tilt angle μ and the rotation angle r where the absolute values of the tilt angle |μ| and the absolute value |r| are each more than zero. The tilt angle μ and the rotation angler of the IDT electrodes 72 can be any suitable non-zero angles. In some embodiments, the illustrated IDT electrode 72 can have the tilt angle μ with a magnitude in a range from 2 degrees to 15 degrees, such as in a range from 2 degrees to 10 degrees. In some embodiments the illustrated IDT electrodes 72 can have a suitable non-zero rotation angle r in a range from −15 degrees to 15 degrees, such as in a range from −10 degrees less than 0 degrees and greater than 0 degrees to 10 degrees. The first fingers 80 and the second fingers 82 are angled relative to the vertical axis y by the rotation angle r. The tilt angle μ and the rotation angle r of the IDT electrode 72 are together configured to cause an increase in a figure of merit of the SAW resonator 4 relative to a configuration having a zero rotation angle and a zero tilt angle in the IDT electrode 12 of FIGS. 1A and 1B. The configuration having zero rotation angle and zero tilt angle only has different tilt and rotation angles and is otherwise like the SAW resonator 4.

The IDT electrode 72 of the SAW resonator 4 has a pitch L that sets the wavelength λ of the SAW resonator 4. The pitch L is typically equal to the wavelength 2.

The piezoelectric layer 10 can include any suitable piezoelectric material. For example, the piezoelectric layer 10 can be a lithium niobate (LN) layer. As another example, the piezoelectric layer 10 can be a lithium tantalate (LT) layer.

In some embodiments, the SAW resonator 4 can include a spinel layer or any other suitable ceramic layer (not shown) under the piezoelectric layer 10. For example, the spinel layer can be a polycrystalline spinel layer or a single polycrystalline spinel layer.

In some embodiments, the SAW resonator 4 can include a temperature compensating layer (shown in FIG. 4D) over the IDT electrode 72. For example, the temperature compensating layer can be a silicon dioxide ($SiO_2$) layer.

The IDT electrodes 72 can include any suitable IDT electrode material. For example, the IDT electrodes 72 can include one or more of an aluminum (Al) layer, a molybdenum (Mo) layer, a tungsten (W) layer, a titanium (Ti) layer, a platinum (Pt) layer, a gold (Au) layer, a silver (Ag) layer, copper (Cu) layer, a Magnesium (Mg) layer, a ruthenium (Ru) layer, or the like. The IDT electrode 72 may include alloys, such as AlMgCu, AlCu, etc. In some embodiments, the IDT electrodes 72 can be multi-layer IDT electrodes. As an example, a multi-layer IDT electrode can include an Al layer over a Mo layer or an Al layer over a W layer.

The tilted and angled IDT electrode 72 of the SAW resonator 4 can be implemented in a variety of types of SAW resonators. For example, a tilted and angled IDT electrode in accordance with any suitable principles and advantages disclosed herein can be implemented in a temperature compensated SAW (TCSAW) resonator, a non-temperature compensated SAW resonator, or a multilayer piezoelectric substrate (MPS) SAW resonator. Example cross sections of example SAW resonators with tilted and angled IDT electrodes will be described with reference to FIGS. 4C to 4F. Any suitable combination of features of the SAW resonators described with reference to FIGS. 4C to 4F can be implemented together with each other.

FIG. 4C is a cross sectional view of a SAW resonator 5 according to an embodiment. In some embodiments, the SAW resonator 4 illustrated in FIGS. 4A and 4B can have the cross section illustrated in FIG. 4C. The illustrated SAW resonator 5 includes a piezoelectric layer 10 and an IDT electrode 104 on the piezoelectric layer 10. The piezoelectric layer 10 can be a lithium niobate layer or a lithium tantalate layer, for example. The IDT electrode 104 can be implemented in accordance with any suitable principles and advantages of the tilted and rotated IDT electrodes disclosed herein. The SAW resonator 5 can be included as a series resonator in a filter. The SAW resonator 5 can be included as a shunt resonator in a filter.

Figure 4D:
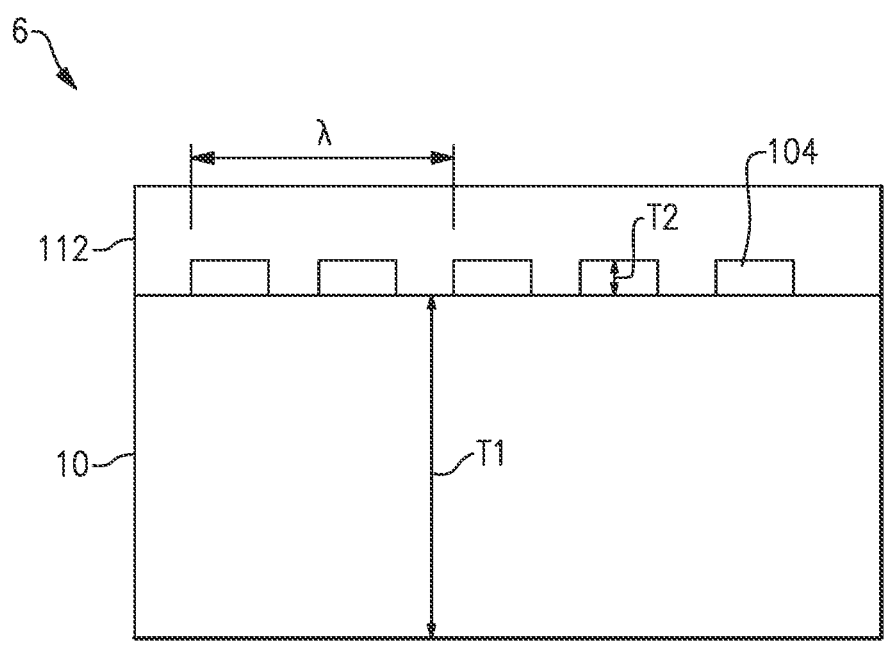
FIG. 4D is a diagram of a cross section of a temperature compensated SAW resonator according to an embodiment.

FIG. 4D is a cross sectional view of a SAW resonator 6 according to another embodiment. In some embodiments, the SAW resonator 4 illustrated in FIGS. 4A and 4B can have the cross section illustrated in FIG. 4D. The SAW resonator 6 is like the SAW resonator 5 illustrated in FIG. 4C, except the SAW resonator 6 includes a temperature compensating layer 112 over the IDT electrode 104. The temperature compensating layer 112 can be referred to as a temperature compensation layer.

The temperature compensating layer 112 can be a silicon dioxide ($SiO_2$) layer. The temperature compensating layer 112 can be a layer of any other suitable material having a positive temperature coefficient of frequency in instances where the piezoelectric layer 10 has a negative temperature coefficient of frequency. For example, the temperature compensating layer 112 can be a tellurium dioxide ($TeO_2$) layer or a silicon oxyfluoride (SiOF) layer in certain applications. A temperature compensating layer can include any suitable combination of, for example, $SiO_2$, $TeO_2$, and/or SiOF. The temperature compensating layer 112 can bring the TCF of the surface acoustic wave resonator 4 closer to zero to thereby provide temperature compensation. The temperature compensating layer 112 can improve the electromechanical coupling coefficient $k^2$ of the SAW resonator 4 relative to a similar SAW resonator without the temperature compensating layer 112. This advantage of the temperature compensating 112 layer can be more pronounced when the piezoelectric layer 10 includes an LN layer.

Figure 4E:
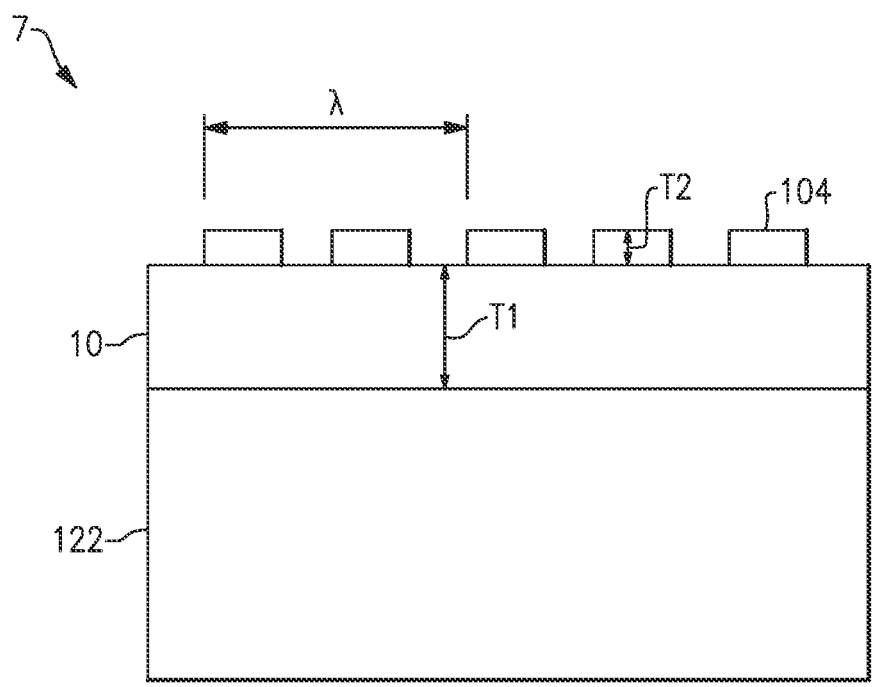
FIG. 4E is a diagram of a cross section of a multilayer piezoelectric substrate SAW resonator according to an embodiment.

FIG. 4E is a cross sectional view of a SAW resonator 7 according to another embodiment. In some embodiments, the SAW resonator 4 illustrated in FIGS. 4A and 4B can have the cross section illustrated in FIG. 4E. The SAW resonator 7 is like the SAW resonator 5 illustrated in FIG. 4C, except the SAW resonator 6 includes a support substrate 122 under the piezoelectric layer 10. The support substrate 122 can be a silicon substrate, a quartz substrate, a sapphire substrate, a polycrystalline spinel substrate, or any other suitable carrier substrate. In an embodiment of the SAW resonator 7, the piezoelectric layer 10 can be a lithium tantalate layer and the support substrate 122 can be a spinel support substrate.

Figure 4F:
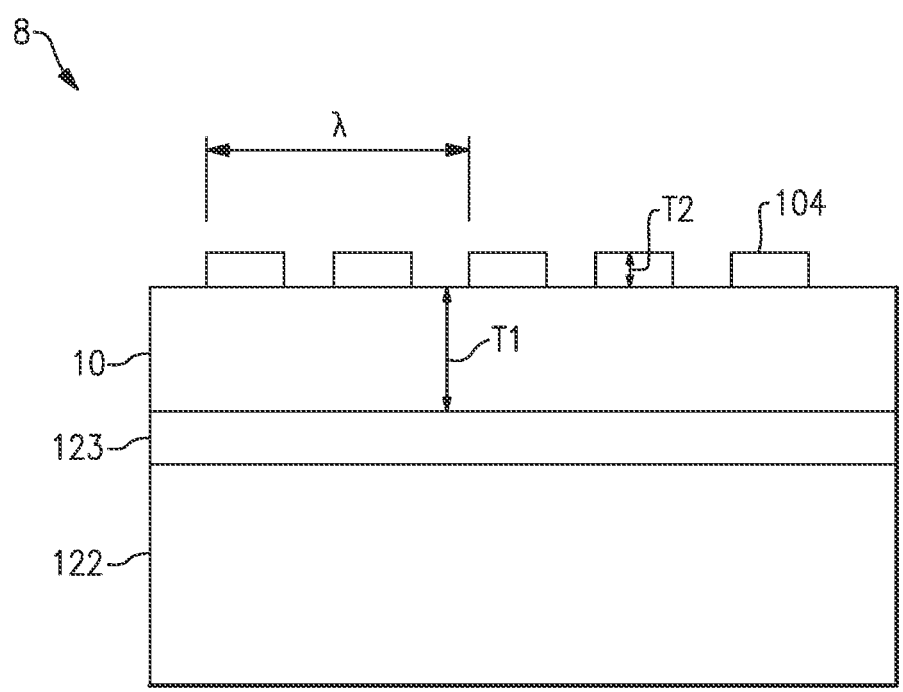
FIG. 4F is a diagram of a cross section of a multilayer piezoelectric substrate SAW resonator according to another embodiment.

FIG. 4F is a cross sectional view of a SAW resonator 8 according to another embodiment. In some embodiments, the SAW resonator 4 illustrated in FIGS. 4A and 4B can have the cross section illustrated in FIG. 4F. The SAW resonator 8 is like the SAW resonator 7 illustrated in FIG. 4E, except the SAW resonator 8 includes a low velocity layer 123 between the piezoelectric layer 10 and the support substrate 122. The low velocity layer 123 can include any suitable material that has an acoustic velocity lower than an acoustic velocity of the piezoelectric layer 10. For example, the low velocity layer 123 can be a silicon oxide layer such as a silicon dioxide layer. In an embodiment of the SAW resonator 8, the piezoelectric layer 10 can be a lithium tantalate layer, the low velocity layer 123 can be a silicon dioxide layer, and the support substrate 122 can be a silicon substrate.

The piezoelectric layer 10 has a thickness T1. The thickness T1 of the piezoelectric layer 10 can be selected based on a wavelength λ or L of a surface acoustic wave generated by the surface acoustic wave resonator 4. The piezoelectric layer 10 can be sufficiently thick to provide good coupling factor. A thickness T1 of the piezoelectric layer 10 of at least 0.1 L can be sufficiently thick to mitigate degradation of the coupling factor due to a relatively thin piezoelectric layer 10. The thickness T1 of the piezoelectric layer 10 can be in a range of, for example, 0.1 L to 0.5 L. In some instances, the thickness T1 of the piezoelectric layer 10 can be in a range from 0.3 L to 0.5 L. The wavelength L of the surface acoustic wave can be, for example, 2 μm and the thickness T1 of the piezoelectric layer 10 can be, for example 0.6 μm, in some embodiments. According to some other instances, the thickness of T1 of the piezoelectric layer can on the order of 10s of L. The thickness of the piezoelectric layer 10 can be in a range from about 20 microns to 30 microns in certain applications. As noted above, the piezoelectric layer 10 can be an LN layer or any other suitable piezoelectric layer (e.g., a lithium tantalate (LT) layer).

The IDT electrode 72 has a thickness T2. In some embodiments, the thickness T2 can be about 0.04 L. In some embodiments, the thickness T2 can be in a range from 0.01 L to 0.08 L. For example, when the wavelength L is 2 μm, the thickness T2 of the IDT electrodes 72 can be 80 nm.

FIG. 5A is a table showing simulated quality factors Qs at a resonant frequency of a SAW resonator according to one embodiment for various tilt angles μ and rotation angles r in degrees. When the title angle μ and rotation angle r are both non-zero, the IDT electrode of the simulated SAW resonator is like to the IDT electrode 72 of FIGS. 4A and 4B with varied tilt and rotation.

FIG. 5B is a table showing simulated quality factors Qp at an anti-resonant frequency of the SAW resonator for various tilt angles μ and rotation angles r in degrees. The quality factor Qs can be a quality factor at resonance frequency. The quality factor Qp can be a quality factor at an anti-resonance frequency.

FIG. 5C is a table showing simulated electromechanical coupling coefficients $k^2$ of the SAW resonator for various tilt angles μ and rotation angles r in degrees.

FIG. 5D is a table showing simulated figure of merit (FOM) values of the SAW resonator for various tilt angles μ and rotation angles r in degrees. The FOM is calculated by multiplying the sum of Qs and Qp by an electromechanical coupling coefficient $k^2$.

Similar simulation results were obtained for the same simulations that were run on different wafers. The simulation results show that the FOM values between a line 90 and a line 92 shown in the table of FIG. 5D are relatively high as compared to the FOM values above the upper line 90 and below the lower line 92. In other words, relatively high FOM values are obtained for the resonator when the tilt angle μ and the rotation angle r has a relationship of: μ=a−r; where a is in a range from to 2° to 14° (2°≤a≤14°).

Figure 6A:
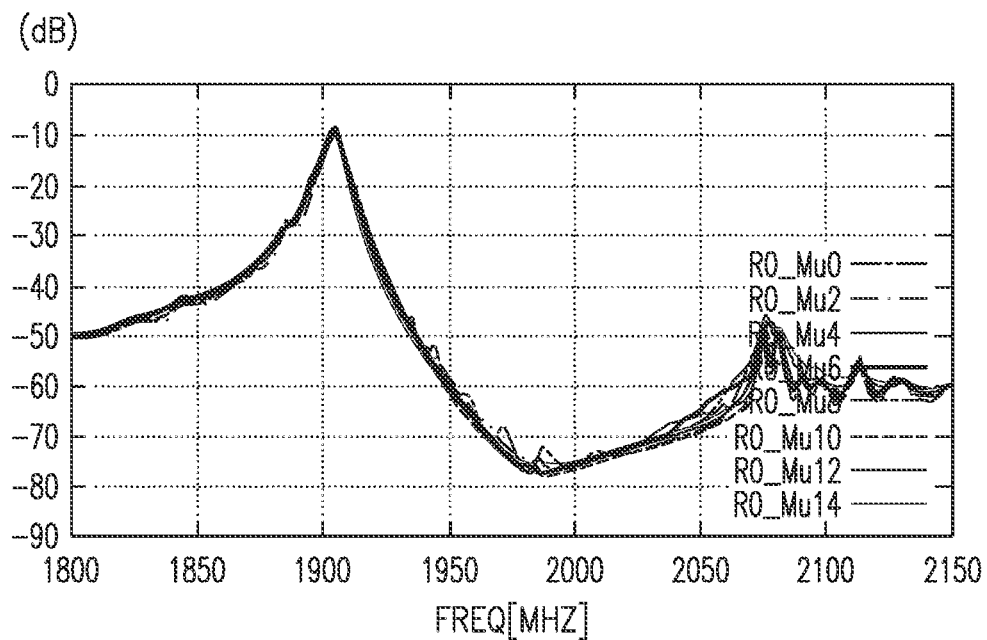
FIG. 6A is a graph showing simulation results of admittance of a SAW resonator.
Figure 6B:
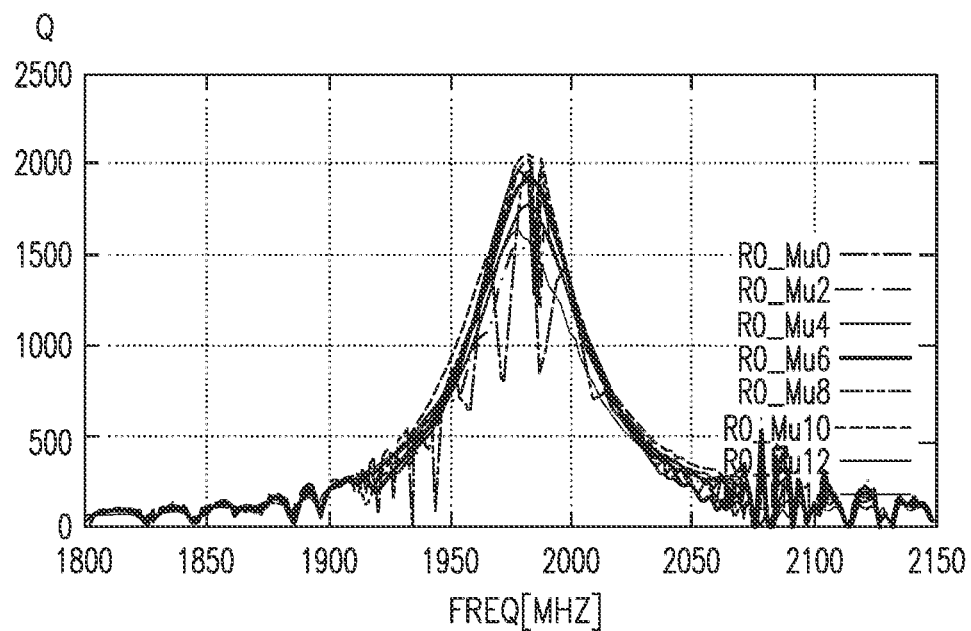
FIG. 6B is a graph showing simulation results of quality factor (Q) of the SAW resonator corresponding to FIG. 6A.
Figure 7A:
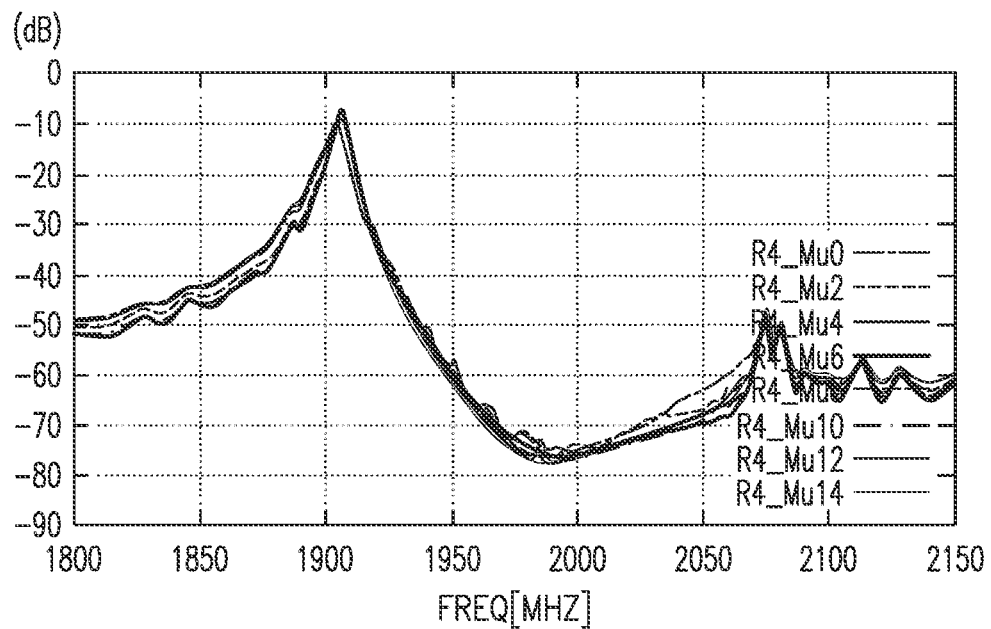
FIG. 7A is a graph showing simulation results of admittance of a SAW resonator according to one embodiment.
Figure 7B:
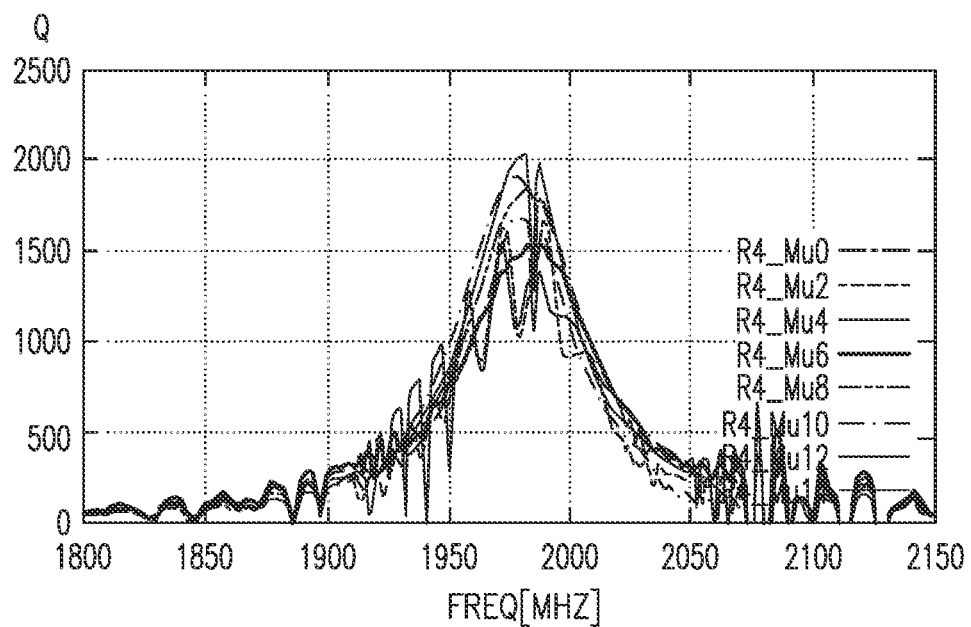
FIG. 7B is a graphs showing simulation results of quality factor (Q) of the SAW resonator corresponding to FIG. 7A.

FIGS. 6A and 7A are graphs showing simulation results of admittance of SAW resonators in different configurations. FIGS. 6B and 7B are graphs showing simulation results of quality factor (Q) of the SAW resonators in different configurations.

FIG. 6A is a graph showing simulation results of admittance of a SAW resonator similar to the SAW resonator 3 illustrated in FIGS. 3A and 3B. FIG. 6B is a graph showing simulated results of quality factor (Q) of the SAW resonator. The simulations corresponding to FIGS. 6A and 6B were performed with the SAW resonator with the rotation angle r of 0° and various tilt angles μ (μ=0°, 2°, 3°, 6°, 8°, 10°, 12°, and 14°).

FIG. 7A is a graph showing simulation results of a real part of admittance in decibel (dB) of a SAW resonator similar to the SAW resonator 4 illustrated in FIGS. 4A and 4B. FIG. 7B is a graph showing simulated results of quality factor (Q) of the SAW resonator. The simulations corresponding to FIGS. 7A and 7B were performed with the SAW resonator with the rotation angle r of 4° and various tilt angles μ (μ=0°, 2°, 3°, 6°, 8°, 10°, 12°, and) 14°.

The simulation results shown in FIGS. 6A to 7B indicate that both the rotation angle r and the tilt angle μ can affect the performance of the SAW resonators. Therefore, various combinations of the rotation angle r and the tilt angles μ can be result in desirable SAW resonators. The simulation results shown in FIGS. 5A to 7B indicate that both the rotation angle r and the tilt angle μ can affect the performance of the SAW resonators. For example, a suitable selection of the rotation angle r and the tilt angle μ can provide relatively high FOM while suppressing the transverse mode.

Acoustic wave resonators disclosed herein can be included in a filter arranged to filter a radio frequency signal. One or more acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW resonators disclosed herein. FR1 can be from 410 megahertz (MHz) to 7.125 gigahertz (GHz), for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band.

Figure 8A:
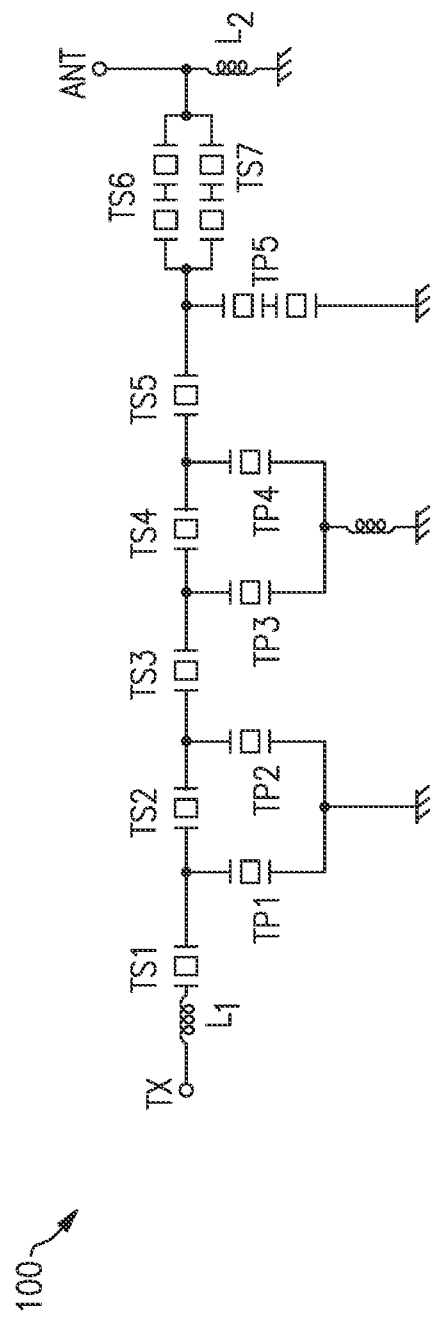
FIG. 8A is a schematic diagram of a transmit filter that includes a surface acoustic wave resonator according to an embodiment.

FIG. 8A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. The illustrated transmit filter 100 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1 to TS7 and/or TP1 to TP5 can be a SAW resonators in accordance with any suitable principles and advantages disclosed herein. For instance, one or more of the SAW resonators of the transmit filter 100 can be a surface acoustic wave resonator 4 of FIG. 4A. Alternatively or additionally, one or more of the SAW resonators of the transmit filter 100 can be any surface acoustic wave resonator disclosed herein. Any suitable number of series SAW resonators and any suitable number of shunt SAW resonators can be included in a transmit filter 100.

Figure 8B:
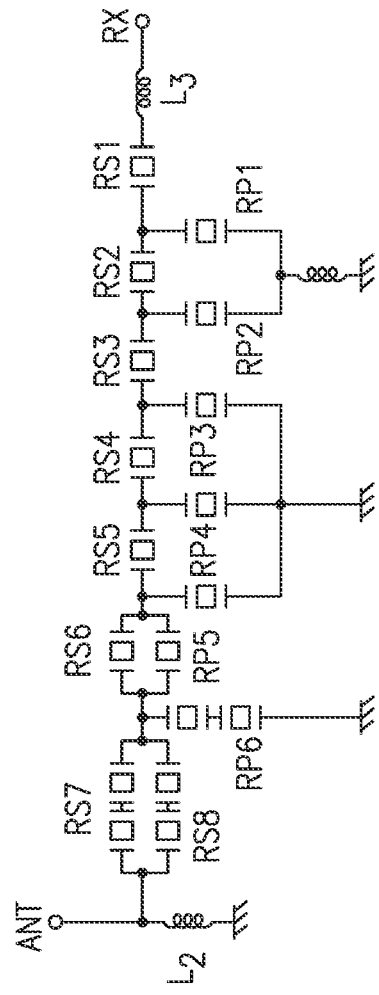
FIG. 8B is a schematic diagram of a receive filter that includes a surface acoustic wave resonator according to an embodiment.

FIG. 8B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. The illustrated receive filter 105 includes series SAW resonators RS1, RS2, RS3, RS4, RS5, RS6, RS7, and RS7, shunt SAW resonators RP1, RP2, RP3, RP4, and RP5, and RP6, shunt inductor L2, and series output inductor L3. Some or all of the SAW resonators RS1 to RS8 and/or RP1 to RP6 can be SAW resonators in accordance with any suitable principles and advantages disclosed herein. For instance, one or more of the SAW resonators of the receive filter 105 can be a surface acoustic wave resonator 4 of FIG. 4A. Alternatively or additionally, one or more of the SAW resonators of the receive filter 105 can be any surface acoustic wave resonator disclosed herein. Any suitable number of series SAW resonators and any suitable number of shunt SAW resonators can be included in a receive filter 105.

Figure 9:
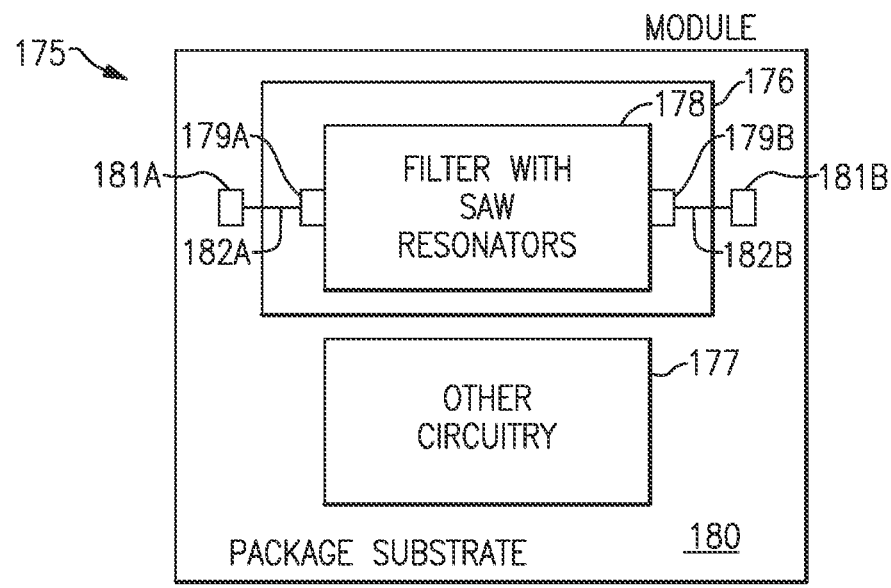
FIG. 9 is a schematic diagram of a radio frequency module that includes a surface acoustic wave resonator according to an embodiment.

FIG. 9 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators disclosed herein. The SAW component 176 can include a SAW die that includes SAW resonators.

The SAW component 176 shown in FIG. 9 includes a filter 178 and terminals 179A and 179B. The filter 178 includes SAW resonators. One or more of the SAW resonators can be implemented in accordance with any suitable principles and advantages of the surface acoustic wave resonator 4 of FIG. 4A and/or any surface acoustic wave resonators disclosed herein. The filter 178 can be a TCSAW filter arranged as a band pass filter to filter radio frequency signals with frequencies below about 3.5 GHz in certain applications. The terminals 179A and 178B can serve, for example, as an input contact and an output contact. The SAW component 176 and the other circuitry 177 are on a common packaging substrate 180 in FIG. 9. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 175. The overmold structure can encapsulate some or all of the components of the radio frequency module 175.

Figure 10:
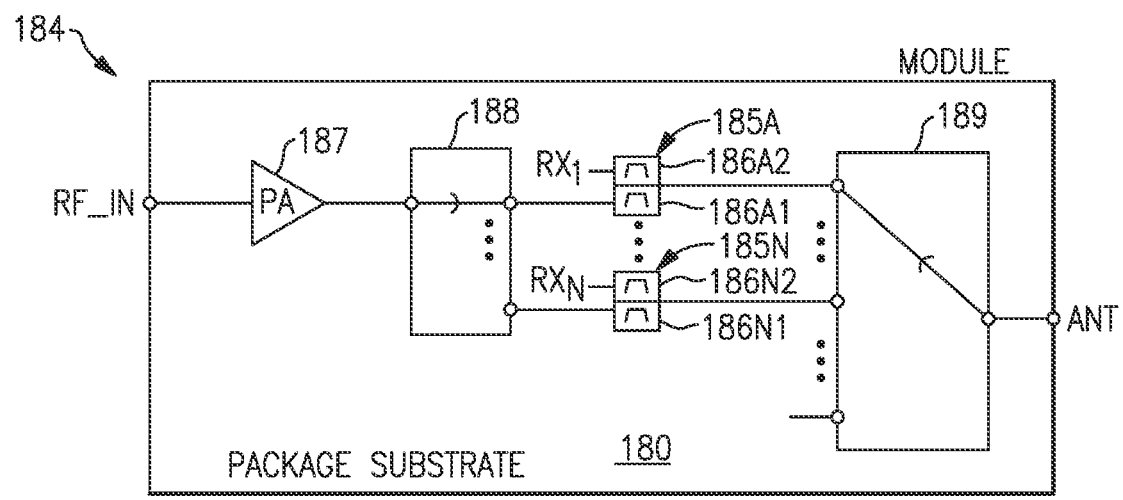
FIG. 10 is a schematic diagram of a radio frequency module that includes filters with surface acoustic wave resonators according to an embodiment.

FIG. 10 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators in accordance with any suitable principles and advantages disclosed herein. Similarly, one or more of the receive filters 186A2 to 186N2 can include one or more SAW resonators in accordance with any suitable principles and advantages disclosed herein. Although FIG. 10 illustrates duplexers, any suitable principles and advantages disclosed herein can be implemented in other multiplexers (e.g., quadplexers, hexaplexers, octoplexers, etc.) and/or in switch-plexers.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 11:
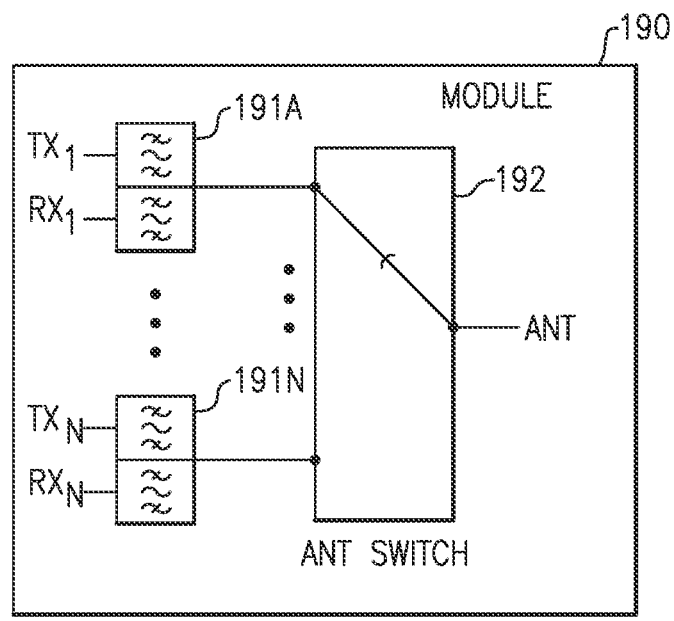
FIG. 11 is a schematic block diagram of a module that includes an antenna switch and duplexers that include a surface acoustic wave resonator according to an embodiment.

FIG. 11 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 12A:
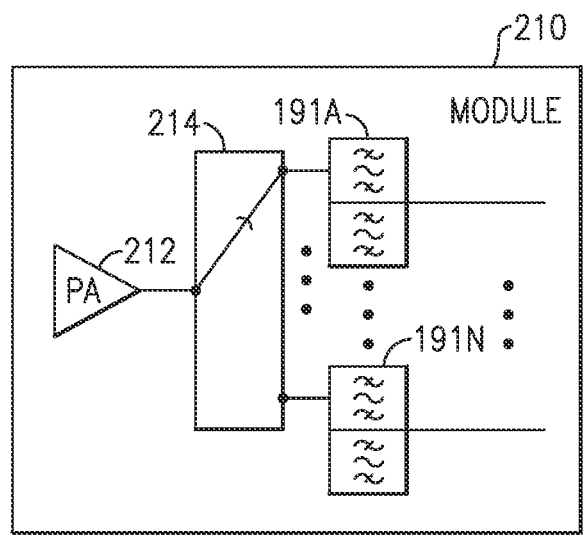
FIG. 12A is a schematic block diagram of a module that includes a power amplifier, a radio frequency switch, and duplexers that include a surface acoustic wave resonator according to an embodiment.

FIG. 12A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 12B:
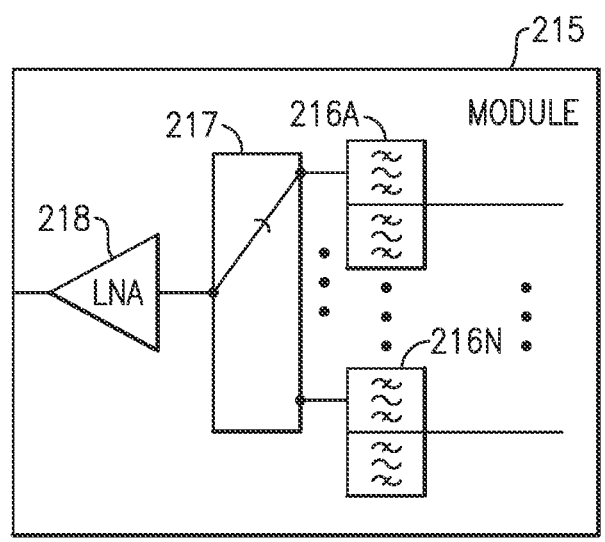
FIG. 12B is a schematic block diagram of a module that includes filters, a radio frequency switch, and a low noise amplifier according to an embodiment.

FIG. 12B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 13A:
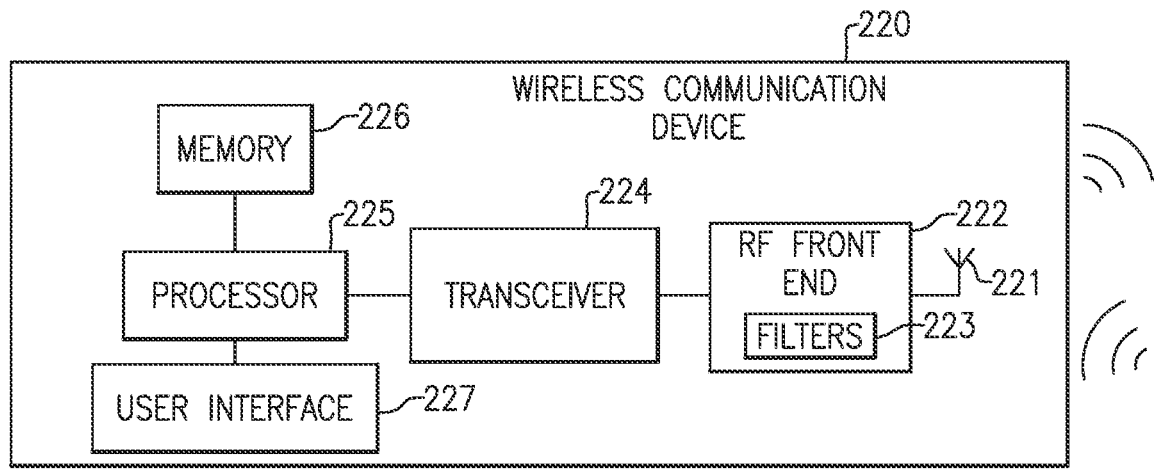
FIG. 13A is a schematic block diagram of a wireless communication device that includes a filter with a surface acoustic wave resonator in accordance with one or more embodiments.

FIG. 13A is a schematic diagram of a wireless communication device 220 that includes filters 223 in a radio frequency front end 222 according to an embodiment. The filters 223 can include one or more SAW resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include SAW resonators of a SAW component that includes any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 13B:
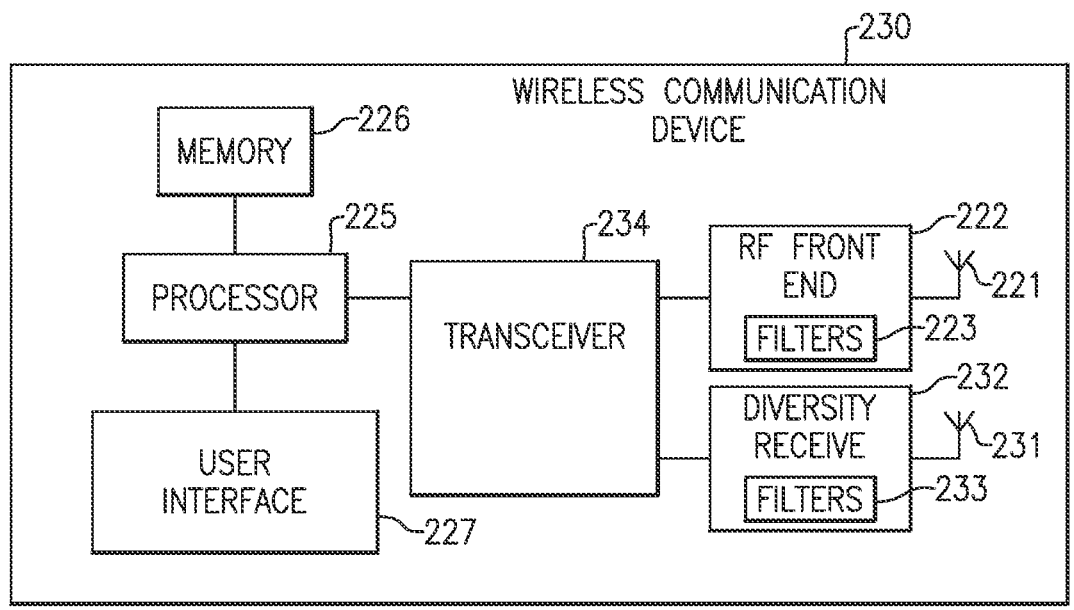
FIG. 13B is a schematic block diagram of another wireless communication device that includes a filter with a surface acoustic wave resonator in accordance with one or more embodiments.

FIG. 13B is a schematic diagram of a wireless communication device 230 that includes filters 223 in a radio frequency front end 222 and a second filter 233 in a diversity receive module 232. The wireless communication device 230 is like the wireless communication device 200 of FIG. 13A, except that the wireless communication device 230 also includes diversity receive features. As illustrated in FIG. 13B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators and/or acoustic wave devices that include an IDT electrode, such as Lamb wave resonators and/or boundary wave resonators. For example, any suitable combination of features of the tilted and rotated IDT electrodes disclosed herein can be applied to a Lamb wave resonator (for example, a Lamb wave resonator) and/or to a boundary wave device (for example, a a boundary wave resonator).

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 GHz, such as in a frequency range from about 410 MHz to 8.5 GHz.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. All numerical values, such as values for rotation angle and tilt angle, in this application and the claims are intended to encompass similar values within error of available measurement techniques. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave resonator comprising:
a piezoelectric layer; and
an interdigital transducer electrode over the piezoelectric layer, the interdigital transducer electrode having a rotation angle and a tilt angle, the rotation angle and the tilt angle both being non-zero, the rotation angle being greater than the tilt angle, a magnitude of the rotation angle being greater than 1°, and a figure of merit of acoustic wave resonator being above 140.

2. The acoustic wave resonator of claim 1 a sum of the rotation angle and the tilt angle being in a range from 2° to 14°.

3. The acoustic wave resonator of claim 2 wherein the rotation angle is in a range from 1° to 15°.

4. The acoustic wave resonator of claim 1 wherein the rotation angle is no greater than 15°.

5. The acoustic wave resonator of claim 1 wherein the tilt angle is at least 6°.

6. The acoustic wave resonator of claim 1 further comprising a support substrate, the piezoelectric layer positioned between the support substrate and the interdigital transducer electrode.

7. The acoustic wave resonator of claim 6 further comprising a low velocity layer positioned between the support substrate and the piezoelectric layer, the low velocity layer having an acoustic velocity lower than an acoustic velocity of the piezoelectric layer.

8. The acoustic wave resonator of claim 7 wherein the low velocity layer is a silicon dioxide layer.

9. The acoustic wave resonator of claim 6 wherein the acoustic wave resonator is a surface acoustic wave resonator configured to generate a surface acoustic wave.

10. The acoustic wave resonator of claim 1 wherein the interdigital transducer electrode includes a bus bar and fingers that extend from the bus bar, the bus bar and the fingers are non-perpendicular to each other.

11. The acoustic wave resonator of claim 10 further wherein the interdigital transducer electrode includes a second bus bar and second fingers extending from the second bus bar, the bus bar and the second bus bar extend approximately parallel to each other.

12. The acoustic wave resonator of claim 1 wherein the piezoelectric layer is a lithium tantalate layer.

13. An acoustic wave resonator comprising:
a multilayer piezoelectric substrate including a support substrate and a piezoelectric layer over the support substrate; and
an interdigital transducer electrode over the piezoelectric layer, the interdigital transducer electrode having a rotation angle and a tilt angle, the rotation angle and the tilt angle both being non-zero, the rotation angle being greater than the tilt angle, a magnitude of the rotation angle being greater than 1°, and a figure of merit of acoustic wave resonator being above 140.

14. The acoustic wave resonator of claim 13 wherein a sum of the rotation angle and the tilt angle being in a range from 2° to 14°.

15. The acoustic wave resonator of claim 14 wherein the rotation angle is in a range from 1° to 15°.

16. The acoustic wave resonator of claim 15 wherein a magnitude of the tilt angle is greater than 1°.

17. An acoustic wave filter comprising:
a first acoustic wave resonator including a piezoelectric layer and an interdigital transducer electrode over the piezoelectric layer, the interdigital transducer electrode having a rotation angle and a tilt angle, the rotation angle and the tilt angle both being non-zero, the rotation angle being greater than the tilt angle, a magnitude of the rotation angle being greater than 1°, and a figure of merit of acoustic wave resonator being above 140; and
a plurality of other acoustic wave resonators, the first acoustic wave resonator and the plurality of other acoustic wave resonators together arranged to filter a radio frequency signal.

18. The acoustic wave filter of claim 17 wherein the rotation angle is in a range from 1° to 15°.

* * * * *